United States Patent [19]

Hori

[11] Patent Number: 5,121,081
[45] Date of Patent: Jun. 9, 1992

[54] OUTPUT WAVEFORM CONTROL CIRCUIT
[75] Inventor: Tsuguo Hori, Tokyo, Japan
[73] Assignee: NEC Corporation, Tokyo, Japan
[21] Appl. No.: 544,431
[22] Filed: Jun. 27, 1990
[30] Foreign Application Priority Data
Jun. 27, 1989 [JP] Japan ................. 1-166152
[51] Int. Cl.⁵ .............................................. H03G 3/30
[52] U.S. Cl. ...................................... 330/279; 455/126
[58] Field of Search ............... 330/129, 279, 284, 302, 330/310; 455/126, 127; 307/260, 263

[56] References Cited

U.S. PATENT DOCUMENTS

| | | | |
|---|---|---|---|
| 4,147,991 | 4/1979 | Ijichi et al. | 330/279 X |
| 4,563,775 | 1/1986 | Yokosuka | 455/126 |
| 4,754,231 | 6/1988 | Sawa | 330/279 |

Primary Examiner—Steven Mottola
Attorney, Agent, or Firm—Sughrue, Mion, Zinn, Macpeak & Seas

[57] ABSTRACT

An output waveform control circuit for a time division multiple access system (TDMA), including a second driving circuit which sends a control signal to the power amplifier in accordance with a signal outputted by the comparator circuit. Thus, by controlling the operating voltage of the power amplifier simultaneously with the control of the level input signal from the input level control circuit, the output characteristic of the power amplifier, including a class C or the like amplifier having a non-linear input/output characteristic, is prevented from varying abruptly, and the output waveform of the power amplifier is so controlled as to have gently sloped leading and trailing edges.

12 Claims, 3 Drawing Sheets

OUTPUT WAVEFORM CONTROL CIRCUIT

BACKGROUND OF THE INVENTION

The present invention relates to an output waveform control circuit of a time division multiple access (TDMA) system, and more particularly to the control of the output waveform of the power amplifier of a transmitter in a TDMA system.

In a TDMA system, in order to prevent the expansion of the spectrum, resulting from the burst switching of the output carrier of a transmitter, from adversely affecting any other transmission channel or the reception channel of the transmitter's own station, the leading and trailing edges of the output signal should be so controlled as to form gentle slopes.

A conventional output waveform control circuit which will be described later referring to FIG. 1 of the accompanying drawings, is disclosed in U.S. Pat. No. 4,706,262 issued to K. Ohta, Nov. 10, 1987 and assigned to the present assignee. In the disclosed circuit, an envelope generating circuit generates a signal whose leading and trailing edges are gently sloped. This signal is then compared by a comparator circuit with a detection signal to provide through a power amplifier an error signal. Next, the error signal supplied by the comparator circuit is applied via a driver circuit to an input level control circuit as a control signal. Responsive to the control signal, the error signal from the power amplifier is so controlled as to become similar to the signal waveform from the envelope detector circuit. In addition, a switching circuit on-off switches the output of a modulator to provide through a frequency converter the switched output to the input level control circuit. The on-off switching at the switching circuit causes the frequency spectrum of the modulator output to be restricted to allow the ON/OFF ratio of the output to be increased.

Since the conventional waveform control circuit smoothes only the leading and trailing edges of the modulator output, the output waveform may still be distorted. This can be due to manufacturing variations of the power amplifier. The distortions on the output waveform cause spurious signals which adversely affect other transmission channels of neighboring base stations.

Furthermore, the rising and falling time of an output in the conventional system may exceed a time period of, for example, 28 microseconds, the standard required for an output with an ON/OFF ratio of 70 dB, under the Groupe Special Mobile (GSM) pan-European mobile telephone system due for launch in July 1991.

Another drawback of the prior art circuit is that the output of the modulator is only switched on and off by the switching circuit and the resulting waveform has steep rising and falling edges. Such a waveform cannot satisfy the GSM standard requiring an output spectrum to have spurious signals of less than 60 dB at $f_o \pm 400$ KHz and of less than 70 dB at $f_o \pm 600$ KHz, where $f_o$ is a center frequency.

SUMMARY OF THE INVENTION

It is, therefore, an object of the present invention to provide an output waveform control circuit capable of providing an output waveform having gently sloped leading and trailing edges, even when using a class C amplifier or the like whose output characteristic is non-linear.

It is another object of the present invention to provide an output waveform control circuit cleared of the above stated disadvantages and having an output waveform conforming to GSM standards.

According to the present invention, there is provided an output waveform control circuit capable of providing an output waveform having gently sloped leading and trailing edges, having a second driver circuit for controlling the source voltage of a power amplifier in accordance with an error signal from a comparator circuit simultaneously with the input level of the power amplifier even if it is of class C or the like having a non-linear output characteristic.

BRIEF DESCRIPTION OF THE DRAWINGS

The above and other objects, features and advantages of the present invention will become more apparent from the following detailed description taken in conjunction with the accompanying drawings in which.

DETAILED DESCRIPTION OF THE PREFERRED EMBODIMENT

Figure 1:
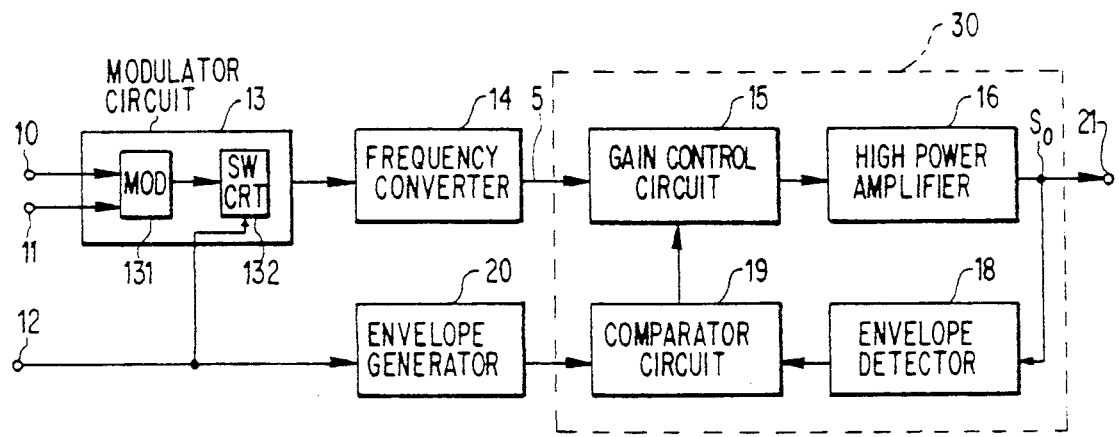
FIG. 1 is a schematic block diagram of an output waveform control circuit of the prior art.

In FIG. 1, the conventional output waveform control includes a gain control circuit 15 to which a high frequency input signal is supplied via terminal 5. The signal is in turn supplied to a high power amplifier 16, where the signal is amplified and sent to output terminal 21. The amplifier output $S_o$ is detected by an envelope detector 18, and compared by a comparator circuit 19 with a reference waveform which is generated by an envelope generator circuit 20 in response to a control signal fed to terminal 12. From the comparison, the comparator circuit 19 provides an error signal, with which the amplification factor of the gain control circuit 15 is controlled. The gain control circuit 15, high power amplifier 16, envelope detector 18 and the comparator circuit 19 constitute an amplitude control unit 30.

Also included in this output waveform control circuit is a modulator circuit 13 which modulates an intermediate frequency (IF) signal fed from an input terminal 10 with a modulating signal fed from another input terminal 11. The output signal thereby modulated is switched on and off by the switching circuit 132 and then converted into a radio frequency (RF) carrier wave by a frequency converter 14 whose output is supplied to the gain control circuit 15 via the terminal 5.

Figure 2:
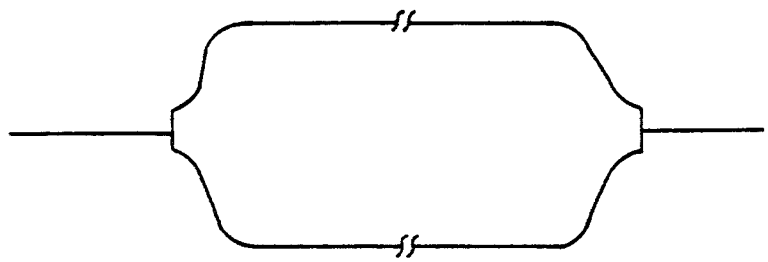
FIG. 2 is a waveform diagram of the output signal from the output waveform control circuit shown in FIG. 1

As mentioned earlier, however, this output waveform control circuit smoothes only the leading and trailing edges of the output of the modulator 13. Therefore, as seen in FIG. 2 the output would be distorted due to manufacturing variations of the power amplifier 16. These distortions cause spurious signals which adversely affect other transmission channels of neighboring base stations in the TDMA system. Another drawback of this system is that it does not meet certain standards set by the Groupe Special Mobile (GSM). Firstly, the rising and falling time in this conventional system may exceed a time period of, for example, 28 microseconds, the maximum standard required for an output with an ON/OFF ratio of 70 dB. Furthermore, the output of the modulator 13 is only switched on and off by the switching circuit 132 and the resulting waveform has steep rising and falling edges. Such a waveform cannot satisfy the above-mentioned GSM standards for the spurious signal levels at $f_o \pm 400$ KHz and $f_o \pm 600$ KHz.

Figure 3:
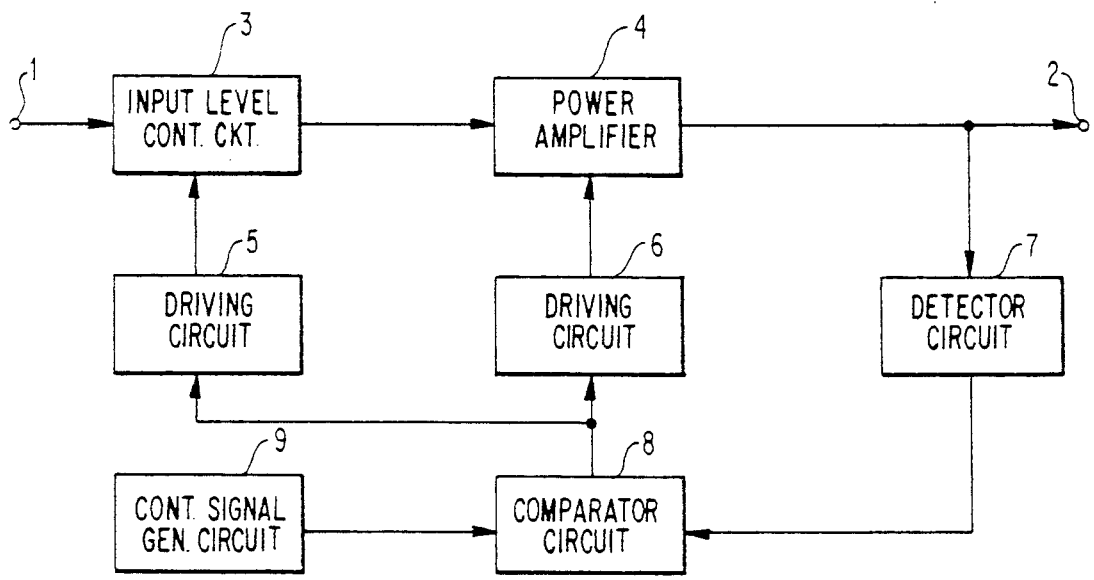
FIG. 3 is a schematic block diagram of an output waveform control circuit according to the invention.

A preferred embodiment of the present invention shown in FIG. 3, has an input signal terminal 1 through which a modulated radio signal is provided to an input level control circuit 3. The input level control circuit 3 controls the level of the input radio frequency signal in response to a level controlsignal from a driving circuit 5. A power amplifier 4, which receives the output of the input level control circuit 3 as its input, has its output level controlled in accordance with the source voltage controlled by a driving circuit 6. A detector circuit 7 detects the envelope of the output signal of the power amplifier 4 to provide a detected signal to comparator circuit 8. The comparator circuit 8, responsive to the difference between the detected signal and a signal generated by a control signal generator 9 which has gently sloped leading and trailing edges, provides an error signal. Based on the error signal, the driver circuit 5 provides as a first driver circuit the level control signal to the input level control circuit 3. In addition to the level control on the basis of the error signal, the driver circuit 6 controls as a second driver circuit the source voltage of power amplifier 4 to thereby control the output level of power amplifier 4. The amplifier 4 provides it output of a waveform shown in FIG. 4 to an output terminal as the output of the output waveform control circuit.

Figure 4:
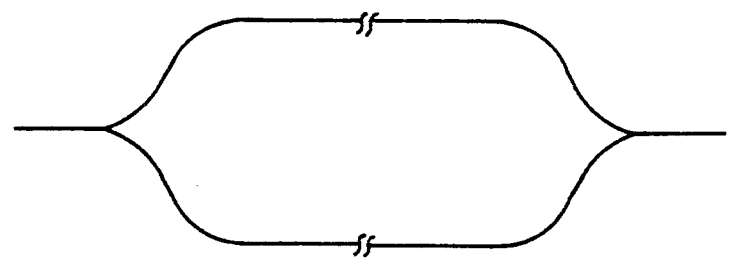
FIG. 4 is a waveform diagram of the output from the output waveform control circuit shown in FIG. 3.

As can be seen from FIG. 4 the waveform of the output from the waveform control circuit shown in FIG. 3 has gentler leading and trailing edges than that shown in FIG. 2. Since the level of the modulation high-frequency signal is controlled by both the input level control circuit 3 and the power amplifier 4, the output signal provided at the terminal 2 has an ON/OFF ratio and a spurious characteristic sufficient to conform to the GSM standards. Even if the power amplifier has manufacturing variations, no distortions will occur in the output signal, because distortion due to the variations is eliminated by controlling the source voltage of power amplifier 4 and thus controlling the output level of same.

Figure 5:
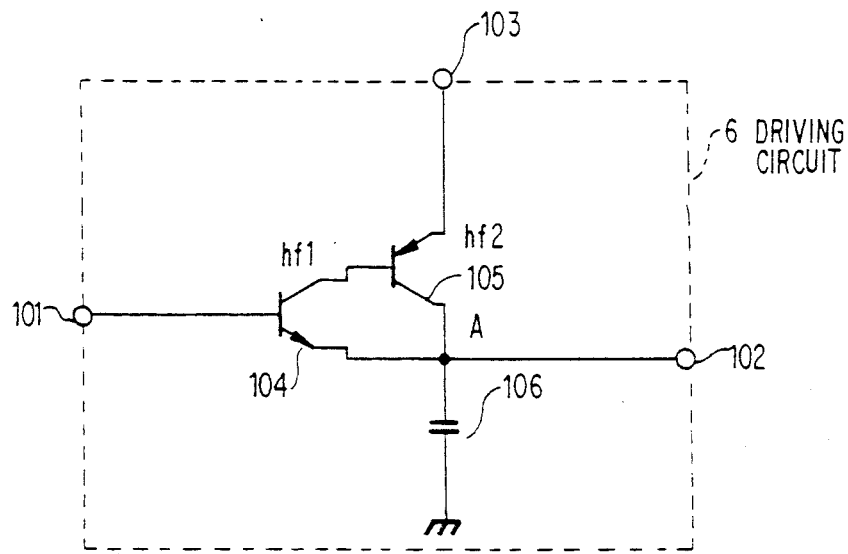
FIG. 5 is a schematic circuit diagram illustrating the driver circuit of the power amplifier shown in FIG. 3.

Referring to FIG. 5 the driver circuit 6 includes an NPN transistor 104 and a PNP transistor 105 connected together as shown to form a Darlington circuit. The input terminal 101 connected to the output of comparator 8 (FIG. 3) is connected to the base of transistor 104, and the collector of transistor 104 is connected to the base of PNP transistor 105. The power supply terminal 103 is connected to the emitter of transistor 105 whose collector is connected at point A which is also connected to the emitter of NPN transistor 104. A capacitor 106 is connected between point A and ground, point A being connected to output terminal 102, which in turn is connected to a source voltage terminal 302 (FIG. 4) for the amplifier 4.

In operation, an input signal is applied to input terminal 101 simultaneously with a bias voltage supplied at terminal 103, to turn on transistors 104 and 105. The connection of these transistors is such that the NPN and PNP transistors of amplification factors $hf_1$ and $hf_2$, respectively, constitute a Darlington circuit having a current amplification factor of $hf_1 \cdot hf_2$. The bypass capacitor 106 is provided to bypass undesired high-frequency noise and to prevent undesired oscillation. Thus, a large current can be controlled by the Darlington circuit in conjunction with an operational amplifier included in the comparator circuit 8. A large driving current is thus derived from the output terminal 102 and provided to the source voltage terminal 302 (FIG. 7).

Figure 6:
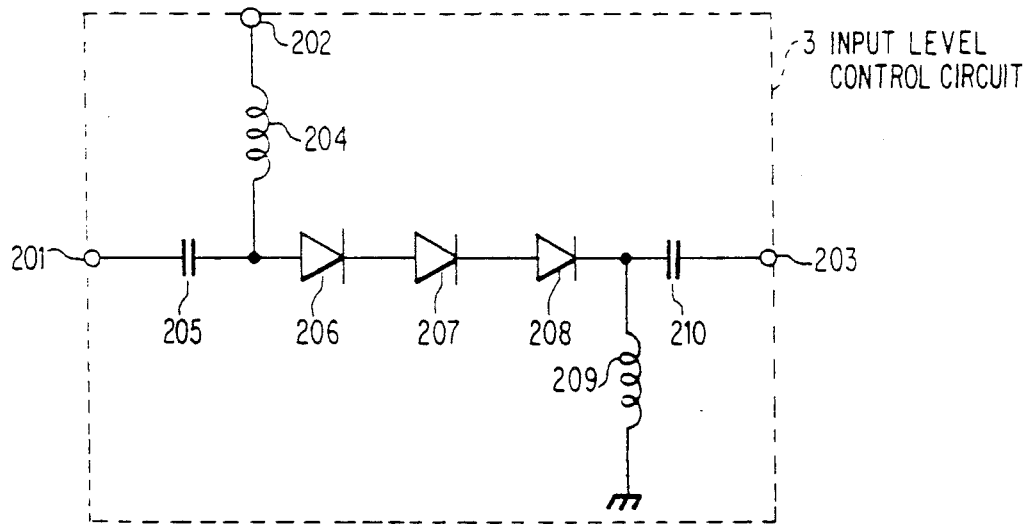
FIG. 6 is a schematic circuit diagram illustrating the power amplifier shown in FIG. 3.

Referring to FIG. 6, the input level control circuit comprises an input terminal 201 connected to the input terminal 1 (FIG. 3) and to the anode of a diode 206 through a capacitor 205. The cathode of the diode 206 is then connected to the anode of the diode 207, which in turn is connected to the anode of the diode 208 whose cathode is connected to the output terminal 203 via a capacitor 210. The bias voltage is applied through a terminal 202 and an inductor 204 from the driving circuit 5 (FIG. 3) to the cascading diodes. A second inductor 209 is also connected between the cathode of diode 208 and the capacitor 210.

In operation, an input signal is applied to terminal 201 and then through capacitor 205 to the anode of diode 206. The capacitor 205 is for eliminating the DC components and associated noise. The bias voltage is applied to the anode of diode 206 through the terminal 202 and the inductor 204, which is for preventing any high frequency signals from reaching the terminal 202. If the bias voltage is greater than a predetermined voltage, the input signal is allowed to pass through the cascading diodes 206, 207 and 208. The capacitor 210 blocks any DC components, allowing them to pass to ground through the inductor 209, which is for preventing any high frequency signals from grounding. The required output signal is then present at the output 203 and provided to the power amplifier 4 (FIG. 3).

Figure 7:
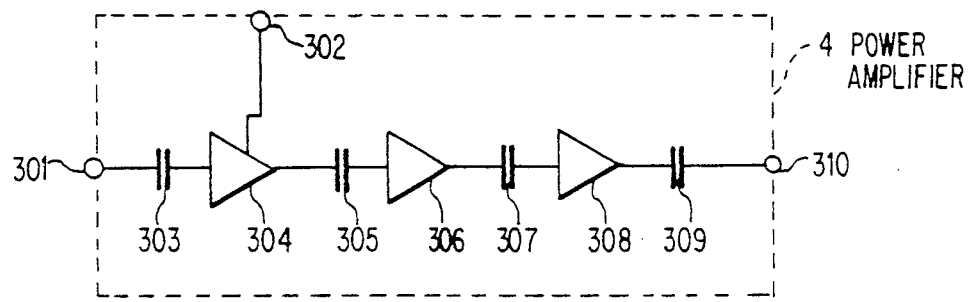
FIG. 7 is a schematic circuit diagram illustrating the input level control circuit shown in FIG. 3.

Referring to FIG. 7, the power amplifier includes a series of cascading amplifiers 304, 306 and 308. The output of level control circuit 3 (FIG. 3) is connected via an input terminal 301 and a capacitor 303 to the input of amplifier 304. The output of amplifier 304 is then connected to the input of amplifier 306 via a capacitor 305. The output of amplifier 306 is connected to the input of amplifier 308 via a capacitor 307. The output of amplifier 308 is connected via a capacitor 309 to the output terminal 310 connected to the output terminal 2 (FIG. 3). The source voltage terminal 302 is connected to amplifier 304.

In operation, the input signal from terminal 301 is applied to the amplifier 304, with the source voltage supplied from terminal 302. The capacitor 303 and succeeding capacitors 305, 307 and 309, block undesired high frequency noise from the incoming signal. Thus, by controlling the source voltage simultaneously with the input signal level, the output characteristic appearing at terminal 310 is prevented from varying abruptly. Therefore, the output waveform of the power amplifier 4 is so controlled as to have gently sloped leading and trailing edges as shown in FIG. 4.

As hitherto described, the simultaneous control of the input signal level and the gain of a power amplifier 4 allows the power amplifier, even if it is of class C or the like having a non-linear output characteristic, to provide an output waveform having gently sloped leading and trailing edges. Thus, the present invention obviates the problem of spurious signals which ma otherwise be unavoidable and adversely affect other transmission channels of neighboring base stations in a TDMA system.

What is claimed is:

1. An output waveform control circuit comprising:
   input level control means for controlling the level of an input signal;
   power amplifier means for amplifying the output signal of said input level control means in accordance with an operating voltage;
   detector circuit means- for detecting the envelope of the output signal of said power amplifier means;
   control signal generator means for generating a reference signal having gently sloped leading and trailing edges;
   comparator circuit means for comparing the output signal of said detector circuit means with said reference signal to provide an error signal;
   error signal; and
   second driver means for controlling said operating voltage in response to said error signal.

2. An output waveform control circuit as claimed in claim 1, wherein said input level control means comprises a series of cascading diodes for receiving said level control signal simultaneously with said input signal to provide an output signal having gently sloped leading and trailing edges.

3. An output waveform control circuit as claimed in claim 1, wherein said second driver means comprises a Darlington circuit including an NPN and a PNP transistors.

4. An output waveform control circuit as claimed in claim 1, wherein said power amplifier means comprises a series of cascading amplifiers supplied with said input signal simultaneously with said operating voltage to provide an output waveform having gently sloped leading and trailing edges.

5. An output waveform control circuit comprising:
   power amplifier means for amplifying an input signal in accordance with an operating voltage, wherein said power amplifier means comprises a series of cascaded amplifiers supplied with said input signal simultaneously with said operating voltage to provide an output waveform having gently sloped leading and training edges;
   detector circuit means for detecting the envelope of an output signal from said power amplifier means;
   control signal generator means for generating a reference signal having gently sloped leading and trailing edges;
   comparator circuit means for comparing the output signal of said detector circuit means with said reference signal from said comparator circuit means, to provide an error signal; and
   driver means for controlling said operating voltage in response to said error signal.

6. A method of controlling an output waveform from a circuit comprising a power amplifier, said method comprising the steps of:
   amplifying an input signal with said power amplifier;
   detecting the envelope of the output signal of said power amplifier to produce a first signal;
   generating a second signal having gently sloped leading and trailing edges;
   comparing said first and second signals to generate an error signal; and
   controlling the operating voltage of said power amplifier in response to said error signal to produce at the output of said power amplifier said output waveform having gently sloped leading and trailing edges
   controlling the level of said input signal, prior to said amplifying step, in response to said error signal.

7. An apparatus comprising:
   level control means for controlling the level of an input signal in response to an error signal;
   power amplifier means for amplifying the output of said level control means and controlling the level of the amplified signal in response to said error signal to produce a level-controlled signal;
   detector means for detecting the envelope of said level-controlled signal to produce an envelope signal;
   signal generator means for generating a control signal having gently sloped leading and trailing edges; and
   comparator means for comparing said envelope signal and said control signal to supply said error signal to said level control means and power amplifier means.

8. An apparatus as claimed in claim 7, wherein said level control means comprises:
   driving circuit means for producing a bias voltage and changing the level of said bias voltage in response to said error signal; and
   diode means for changing the level of said input signal in response to said bias voltage.

9. An apparatus as claimed in claim 7, wherein said power amplifier means comprises:
   driving circuit means for producing an operating voltage and changing the level of said operating voltage in response to said error signal; and
   amplifier circuit means for changing the level of said amplified signal in response to said operating voltage.

10. An apparatus claimed in claim 9, wherein said driving circuit means comprises a Darlington circuit.

11. An apparatus claimed in claim 9, wherein said amplifier circuit means comprises a plurality of amplifiers connected in series at least one of which is driven with said source voltage.

12. A method of controlling the level of a modulated high-frequency signal, comprising the following steps of:
   level controlling said modulated high-frequency signal, in response to a first control signal, to produce a first smoothed signal;
   amplifying and level controlling said first smoothed signal, in response to a second control signal, to produce a second smoothed signal;
   detecting the envelope of said second smoothed signal to produce an envelope signal;
   generating a reference signal having gently sloped leading and trailing edges;
   comparing said envelope signal with said reference signal to produce an error signal; and
   producing said first and second control signals in response to said error signal.

* * * * *